United States Patent
Van Der Heide

(10) Patent No.: US 6,750,662 B1
(45) Date of Patent: Jun. 15, 2004

(54) APPARATUS FOR LOCALIZING PRODUCTION ERRORS IN A PHOTOVOLTAIC ELEMENT

(75) Inventor: Arvid Sven Hjalmar Van Der Heide, Burgerbrug (NL)

(73) Assignee: Stichting Energieonderzoek Centrum Nederland, Petten (NL)

(*) Notice: Subject to any disclaimer, the term of this patent is extended or adjusted under 35 U.S.C. 154(b) by 78 days.

(21) Appl. No.: 10/089,546

(22) PCT Filed: Sep. 27, 2000

(86) PCT No.: PCT/NL00/00691

§ 371 (c)(1),
(2), (4) Date: Apr. 1, 2002

(87) PCT Pub. No.: WO01/26163

PCT Pub. Date: Apr. 12, 2001

(30) Foreign Application Priority Data

Oct. 4, 1999 (NL) .............................................. 1013204

(51) Int. Cl.[7] .......................... H01L 31/18; G01R 31/26
(52) U.S. Cl. ...................................................... 324/702
(58) Field of Search ................................ 324/702, 765, 324/752, 753, 763, 762, 501, 522

(56) References Cited

U.S. PATENT DOCUMENTS

| | | | |
|---|---|---|---|
| 4,301,409 A | 11/1981 | Miller et al. ................. 324/158 |
| 4,451,970 A | 6/1984 | Izu et al. ...................... 29/574 |
| 4,464,823 A | 8/1984 | Izu et al. ...................... 29/572 |
| 4,599,558 A | * 7/1986 | Castellano, Jr. et al. .... 324/752 |
| 4,640,002 A | * 2/1987 | Phillips et al. ................ 438/12 |
| 5,517,128 A | * 5/1996 | Henninger .................... 324/765 |
| 5,718,040 A | * 2/1998 | Faure et al. ................... 29/846 |

FOREIGN PATENT DOCUMENTS

EP 0 087 776 9/1983 ........... H01L/31/18

OTHER PUBLICATIONS

Boyeaux J P et al; "Light Beam Induced Current Mapping Applied to the Control of High Efficiency Gas Solar Cells" Photovoltaic Specialists COnference, US, New York, IEEE, vol. Conf. 19, 1987, pp. 804–807, XP000044719, The Whole Document.
Patent Abstracts of Japan vol. 010, No. 217 (E–423), Jul. 29, 1986 & JP 61 054681 A (Fuji Electric Corp Res & Dev Ltd.) Mar. 18, 1986 Abstract Copy of International Search Report.

* cited by examiner

Primary Examiner—Albert Decady
Assistant Examiner—James Kerveros
(74) Attorney, Agent, or Firm—Michael D. Bednarek; Shaw Pittman LLP

(57) ABSTRACT

Apparatus for localizing production errors in a photovoltaic element which is formed substantially by a semiconductor substrate in the form of a wafer, on opposite main surfaces of which are arranged electrical conductors for transporting electrical charge carriers. The apparatus includes at least one first electrode in electrical contact with a first main surface of the substrate and displaceable over the substrate, and a second electrode to be arranged in electrical contact with the conductors on the second main surface. A voltage measuring device is provided for measuring the voltage between the at least one first and the second electrode subject to the position of the first electrode on the first main surface, and a device for adjusting a bias over the electrical conductors on the opposite main surfaces of the substrate.

15 Claims, 5 Drawing Sheets

APPARATUS FOR LOCALIZING PRODUCTION ERRORS IN A PHOTOVOLTAIC ELEMENT

BACKGROUND OF THE INVENTION

1. Field of the Invention

The invention relates to an apparatus for localizing production errors in a photovoltaic element which is formed substantially by a semiconductor substrate in the form of a wafer, on opposite main surfaces of which are arranged electrical conductors for transporting electrical charge carriers.

2. Description of Related Art

A generally known example of such a photovoltaic element is the crystalline silicon solar cell, which is assembled from layers of semiconducting silicon of different conductivity type, wherein a metallization pattern of a silver-rich material is applied using a screen printing technique to the side adapted to receive incident sunlight (the front side), and wherein the opposite side (the rear side) is wholly covered by a conducting layer (so-called rear side metallization), for instance of aluminium. The metallization pattern is for instance composed of a system of relatively narrow lines (so-called fingers) and a system of relatively wide lines (so-called busbars) connected thereto. During manufacture production errors can occur at numerous locations in such a photovoltaic element, for instance in the fingers, in the contact areas between fingers, busbars or rear side metallization on the one hand and the semiconductor material on the other, or in the semiconductor material itself. These production errors result in a reduced efficiency of the photovoltaic element. If production errors occur systematically, this will of course lead to a high waste during production and accordingly to high costs.

BRIEF SUMMARY OF THE INVENTION

It is an object of the invention to provide an apparatus with which production errors of diverse nature in a photovoltaic element of the type stated in the preamble can be localized, using which the systematic production errors which occur can be identified at an early stage, and waste resulting from occurring systematic errors is limited to a minimum.

It is a further object to provide such an apparatus which is simple to operate, which can be manufactured and serviced at low cost, and which is durable and reliable in use.

These objectives are achieved, and other advantages obtained, with an apparatus of the type specified in the preamble, comprising according to the invention at least one first electrode in electrical contact with a first main surface of said substrate and displaceable over said substrate a second electrode to be arranged in electrical contact with a conductor on the second main surface, displacing means for displacing the first electrode over said first main surface, voltage measuring means for measuring the voltage between the at least one first and the second electrode subject to the position of the first electrode on said first main surface, and adjusting means for adjusting a bias over the electrical conductors on the opposite main surfaces of said substrate.

With an apparatus according to the invention it is possible in simple manner to detect a local voltage change which indicates a production error. Thus detected, systematically occurring voltage changes indicate a systematically occurring production error at the detected position, which error can be further analysed.

By adjusting a bias which in polarity is equal to, and in absolute value is smaller than the voltage at which a photovoltaic element arranged in the dark does become substantially conductive, an apparatus becomes available with which local errors in the semiconductor substrate are detected in simple manner. When such a detection is carried out, the semiconductor wafer in question is arranged in complete darkness. Examples of errors which can be detected with the apparatus applied in this manner are micro-cracks in the semiconductor material, an electrical conductor extending too deeply into the semiconductor material, contamination of the semiconductor material or a short-circuit between the conductors on the two main surfaces of the semiconductor wafer occurring via the edge of the semiconductor wafer.

In one embodiment of an apparatus for localizing production errors, wherein the first main surface is adapted to receive incident light, the apparatus further comprises according to the invention illuminating means for illuminating at least a part of said first main surface.

With this embodiment an apparatus becomes available with which errors can be detected in simple manner in the electrical conductors, in the transitions between electrical conductors and the semiconductor substrate, and in the upper layer of the semiconductor substrate (the emitter). Examples of errors which can be detected with the apparatus applied in this manner are resistances which are too high or cracks in the conductors, poor contacts between conductors and semiconductor substrate and imperfections in the surface of the semiconductor substrate.

In an embodiment wherein the illuminating means are adapted to project a light spot on said first main surface of a substrate on which the arranged electrical conductors extend in substantially parallel manner, the light spot preferably has a diameter which is greater than the distance between two parallel conductors.

In order to localize errors in crystalline silicon solar cells of a known type, wherein the distance between parallel fingers amounts to about 2 to 3 mm, this diameter amounts for instance to about 4 mm, so that there is a uniform illumination by the light spot between the fingers, but the current generated by the illumination is relatively low. As a result voltage gradients on the fingers and busbars are negligibly small, and the apparatus is particularly sensitive to voltage gradients which are the result of variations in the contact resistance between conductors and semiconductor substrate.

In an apparatus according to the invention which is provided with illuminating means, the bias preferably has a value of zero and the adjusting means consist of short-circuiting means for short-circuiting the electrical conductors on the opposite main surfaces of said substrate.

In an advantageous embodiment the first electrode is displaceable over the substrate in two mutually perpendicular directions.

The first electrode comprises for instance a needle directed substantially perpendicularly of the substrate and provided with a contact point, wherein the contact point preferably has a radius which is smaller than the smallest dimension of an electrical conductor on said first main surface.

Said needle is manufactured substantially from a sufficiently hard material, preferably a copper-beryllium alloy, more preferably tungsten. A tungsten needle has the advantage that it breaks easily through an insulating anti-reflection layer on a solar cell and thus makes contact with the emitter layer situated under this anti-reflection layer.

BRIEF DESCRIPTION OF THE DRAWINGS

The invention will be elucidated hereinbelow on the basis of embodiments, with reference to the drawings.

In the drawings.

Corresponding components are designated in the drawings with the same reference numerals.

DETAILED DESCRIPTION OF THE INVENTION

Figure 1:
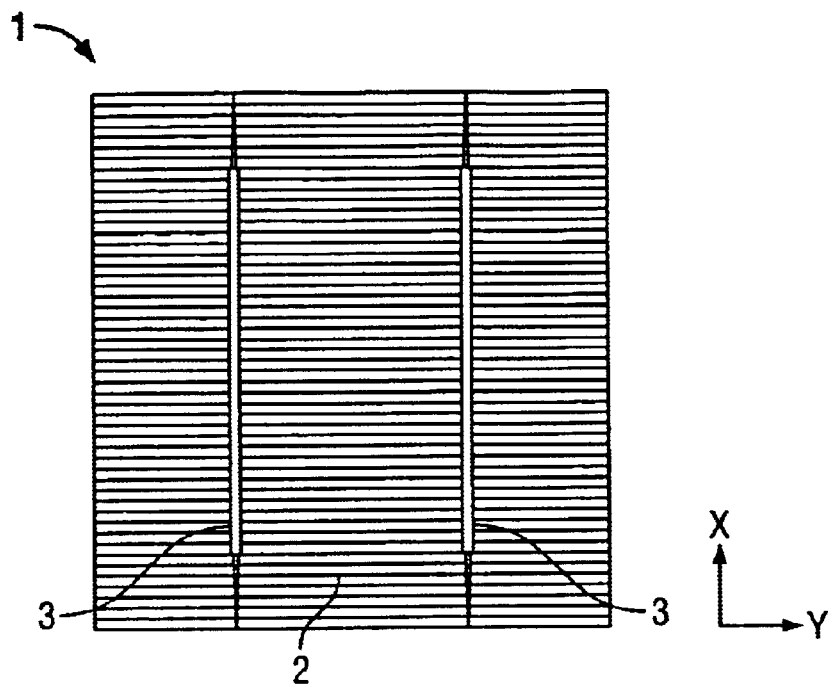
FIG. 1 shows in top view a prior art solar cell of crystalline silicon.

FIG. 1 shows the front side of a square crystalline silicon solar cell 1 according to the prior art adapted to receive incident sunlight (dimensions 12.5 cm×12.5 cm) with a so-called H-shaped metallization pattern of parallel fingers 2 which are applied in accordance with a known screen printing technique, and contact strips (busbars) 3, which have a higher conductivity than the fingers. A coordinate system (x, y) is also shown.

Figure 2:
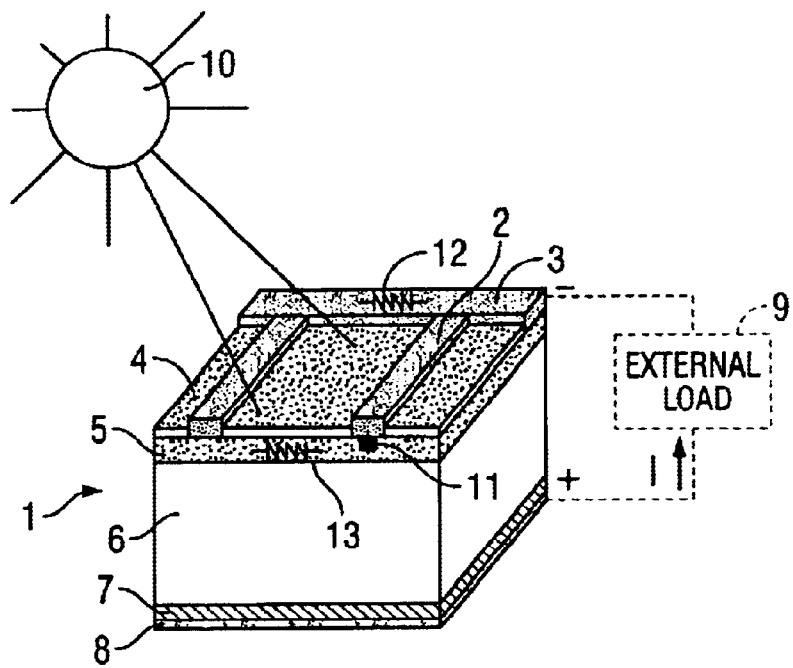
FIG. 2 shows in perspective view a part of the solar cell of FIG. 1.

FIG. 2 shows a part of solar cell 1 of FIG. 1, which is built up of a layer 5 of n—Si (the emitter), a layer 6 of p—Si (the base) and a layer 7 of $p^+$—Si. Applied to the opposite main surfaces are conductors: fingers 2 connected to busbars 3 on the side adapted to receive sunlight (the front side) and an even layer of aluminium 8 on the opposite side (the rear side). The front side is further provided with an anti-reflection coating layer 4. When light is incident (symbolically represented by sun 10), solar cell 1 can be used as power source, wherein an external load 9 can be connected over rear side 8 and busbars 3, whereby a current I begins to flow. Symbolically designated are the contact resistance 11 between metal lines 2, 3 and the solar cell material 5, the resistance 12 in metal lines 2, 3 and resistance 13 of emitter 5.

Figure 3:
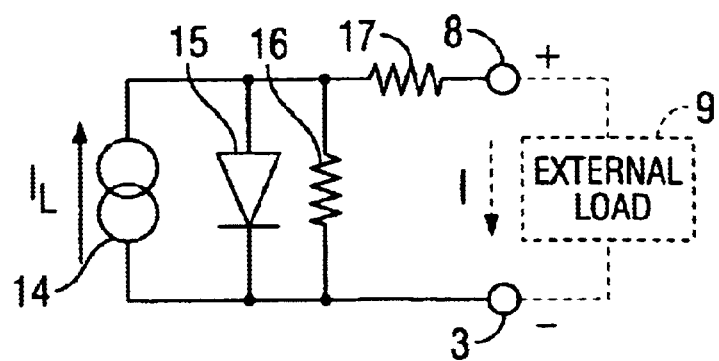
FIG. 3 shows a circuit diagram of the solar cell according to FIG. 1.

FIG. 3 shows a circuit diagram of solar cell 1 according to FIG. 1, which is represented by a power source 14 with a diode 15, a parallel resistance 16 and a series resistance 17, the magnitude of which is substantially determined by the resistances 11, 12 and 13 shown in FIG. 2. The contribution of the resistance 12 in fingers 2 and busbars 3 to the series resistance 17 is determined by the design of solar cell 1, wherein the line width is normally optimized between efficiency losses of the solar cell as a result of too high a resistance in the case of lines 2, 3 which are too narrow on the one hand and too large a shadow surface on emitter layer 5 in the case of lines 2, 3 which are too wide on the other. The resistance in the rear side layer 8 is of less importance, since layer 8 is applied evenly over the layer 7 of $p^+$—Si of solar cell 1.

Figure 4:
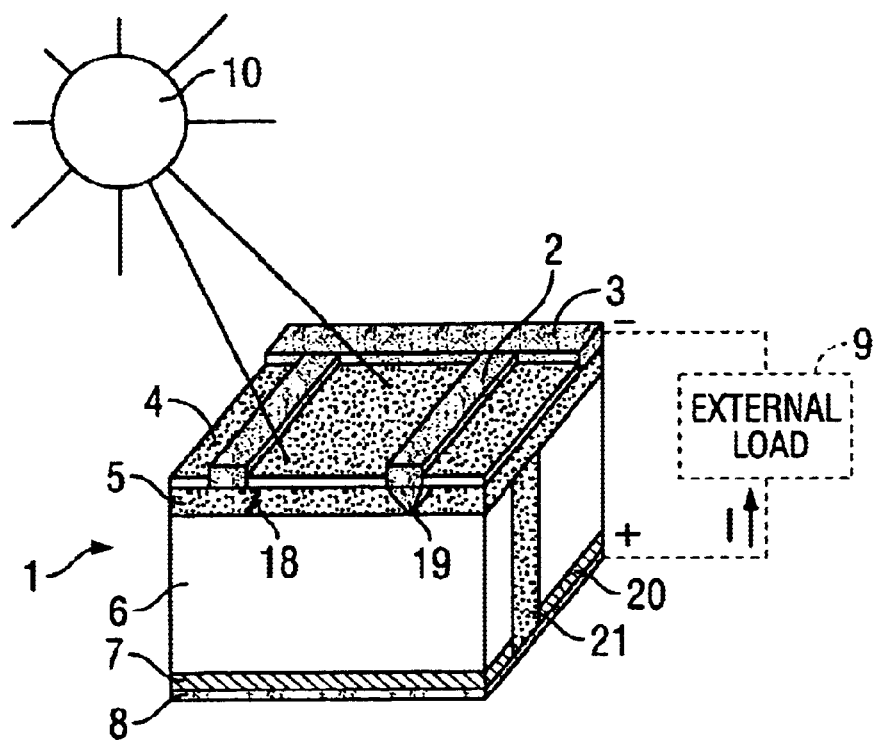
FIG. 4 shows in perspective view a part of a solar cell according to FIG. 1, wherein some local errors in the semiconductor substrate (production errors) are shown schematically.

FIG. 4 shows a part of solar cell 1 of FIG. 1, wherein several local errors in the semiconductor substrate (production errors) are shown schematically. These production errors comprise micro-cracks 18 in base 6 or emitter 5, a metallization line 2, the underside 19 of which runs through into base 6, a contamination 20 in semiconductor substrate 5, 6, 7 and an interconnection 21 of emitter 5 to the bottom conductor 8 via the edge of cell 1. Said production errors 18–21 all contribute toward the reduction of the parallel resistance 16 (FIG. 3) of solar cell 1.

Figure 5:
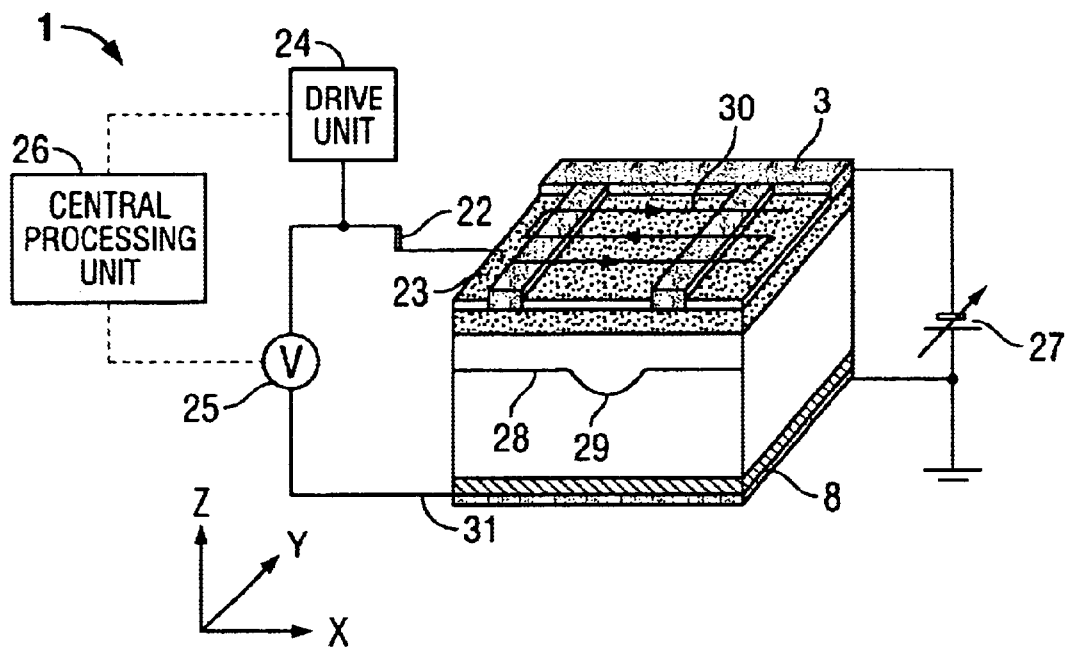
FIG. 5 shows a perspective view of a schematic representation of a first embodiment of an apparatus according to the invention for detecting local errors in the semiconductor substrate.

FIG. 5 shows schematically a first embodiment of an apparatus according to the invention which is suitable for localizing errors which contribute toward the reduction of the parallel resistance 16 (FIG. 3) of cell 1. The apparatus comprises a measuring pin 22 which is provided with a needle 23, a drive unit 24 for measuring pin 22, a voltmeter 25 which is connected respectively to front side 2, 3, 5 and rear side 8 of solar cell 1 via needle 23 and a second electrode 31, a central processing unit 26, in addition to a voltage source 27 by means of which a voltage is applied between a busbar 3 and rear side 8. The figure further also shows a reference frame for the three mutually perpendicular directions of movement X, Y, Z for needle 23. The detection of parallel resistance losses using the shown apparatus proceeds as follows. Solar cell 1 is arranged in the dark, such that no current $I_L$ (cf. FIG. 3) is generated. Voltage source 27 is connected with a polarity such that the diode 15 of the equivalent circuit diagram of cell 1 (FIG. 3) conducts in forward direction. The value of the applied voltage is chosen such that the diode current is sufficiently low. Under these conditions currents can only flow through cell 1 at positions where there is a low parallel resistance, for instance at the position of a micro-crack 18. Such currents are the cause of a local reduction in the potential of the surface of cell 1, which potential is measured using voltmeter 25 and needle 23. The exact location of a local minimum voltage is determined in accordance with a per se known method by relating in central processing unit 26 the information concerning the position of needle 23, originating from drive unit 24, to the value for the potential determined by voltmeter 25. A potential curve 28 is drawn schematically in solar cell 1 as a function of the position (in X-direction), with a local minimum 29 caused by micro-crack 18. Using drive unit 24 it is possible to carry needle 23 above the surface of cell 1, to lower this needle onto the surface along the Z-direction and then have it describe successive paths in a determined direction (the X-direction) along the designated path 30.

Figure 6:
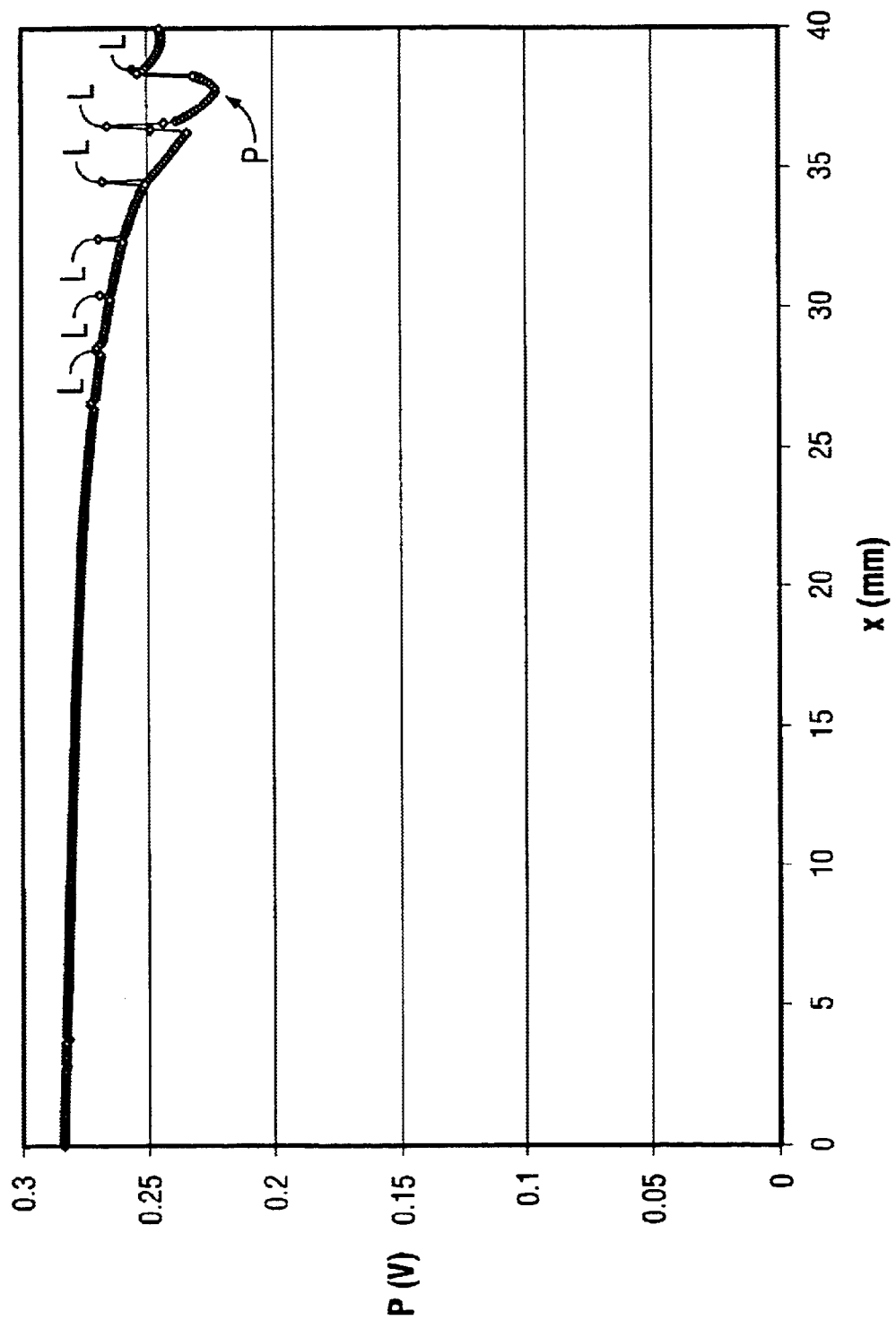
FIG. 6 is a graphic representation of a measurement result obtained with the apparatus according to FIG. 5.

FIG. 6 is a graphic representation of a potential measured with the apparatus according to FIG. 5 as a function of the position along a straight line in X-direction over the surface of cell 1, i.e. perpendicular to the fingers 2 extending at a mutual distance of about 2 mm in Y-direction. The minimum P in the curve shows that in the cell in question an error is present at a distance of about 38 mm from the origin, which error results in a reduction of the parallel resistance. The local maxima in the curve indicated by arrows L are a consequence of the high value of the potential on the path followed by needle 23 at positions where this path intersects fingers 2. By measuring thus measured potential curves in X-direction for successive values of the Y-coordinate and storing them in a memory it is possible according to a per se known method to produce an image in colour of cell 1 in top view on for instance a screen, on which image the position of errors in cell 1 which cause a reduction in the parallel resistance can be immediately identified from locally occurring, sudden colour transitions.

Figure 7:
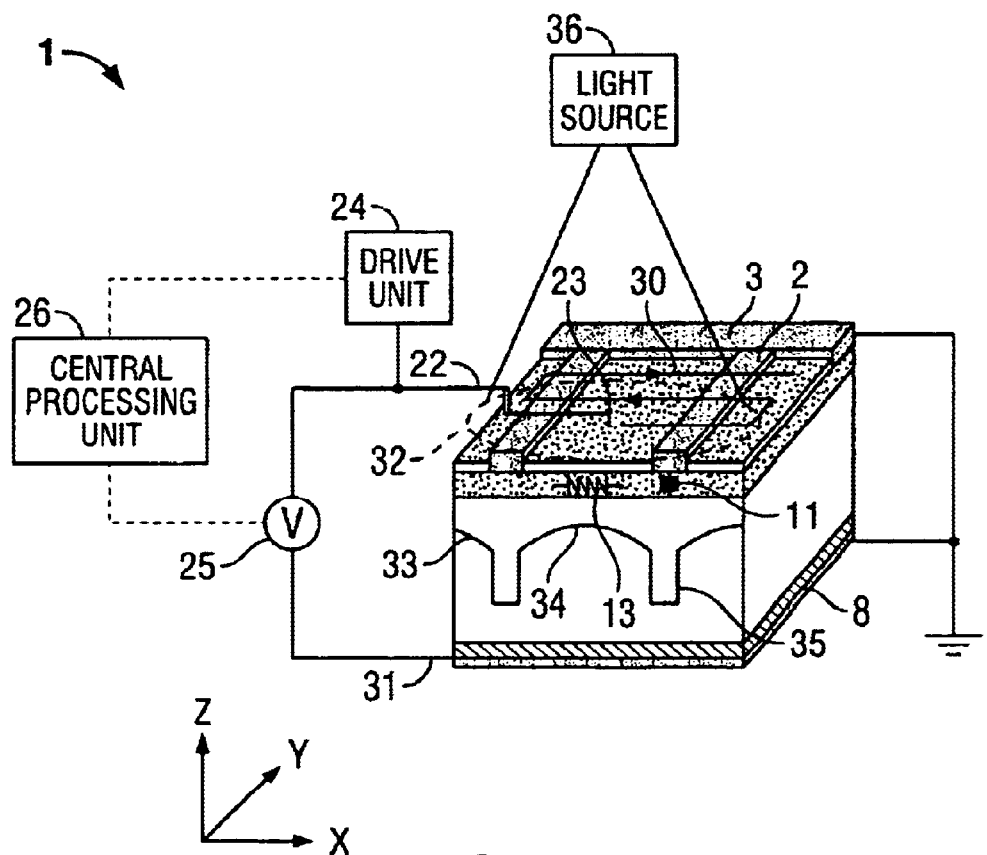
FIG. 7 shows in perspective view a schematic representation of a second embodiment of an apparatus according to the invention for detecting local errors in the electrical conductors in the transitions between electrical conductors and the emitter and in the emitter.

FIG. 7 shows schematically a second embodiment of an apparatus according to the invention which is suitable for localizing errors which contribute toward series resistance 17 (FIG. 3) of cell 1. The apparatus differs from the apparatus shown in FIG. 5 in that a short-circuit is arranged between a busbar 3 and rear side 8, and in the presence of a light source 36, which projects a light spot 32 on the surface of cell 1 with a diameter which is greater than the mutual distance between two successive parallel fingers 2. The detection of series resistance losses using the shown apparatus proceeds as follows. A portion of the cell is illuminated by light source 36, which casts a beam with a well defined and relatively small cross-section onto the cell surface, so that the current density can be determined in simple manner from the quotient of short-circuit current and beam cross-section. The short-circuit serves to hold the local current density in cell 1 as constant as possible over the whole cell surface. There thus flows a practically constant short-circuit current. Contributions to the series resistance are the cause of a local increase in the potential of the surface of cell 1, this potential being measured using voltmeter 25 and needle 23. The exact location of a local contribution to the series resistance is determined in accordance with a per se known method in central processing unit 26 by relating the information about the position of needle 23, originating from drive unit 24, to the value for the potential determined with voltmeter 25. A potential curve 33 is drawn schematically in solar cell 1 as a function of the position (in X-direction), with a parabolic curve 34 caused by the (symbolically represented) emitter resistance 13 and potential jumps 35 caused by contact resistance 11. As in the embodiment discussed under FIG. 5, it is possible using drive unit 24 to carry needle 23 above the surface of cell 1, to lower this needle onto the surface along the Z-direction and to then have it describe successive paths in a determined direction (the X-direction) along the designated path 30.

Figure 8:
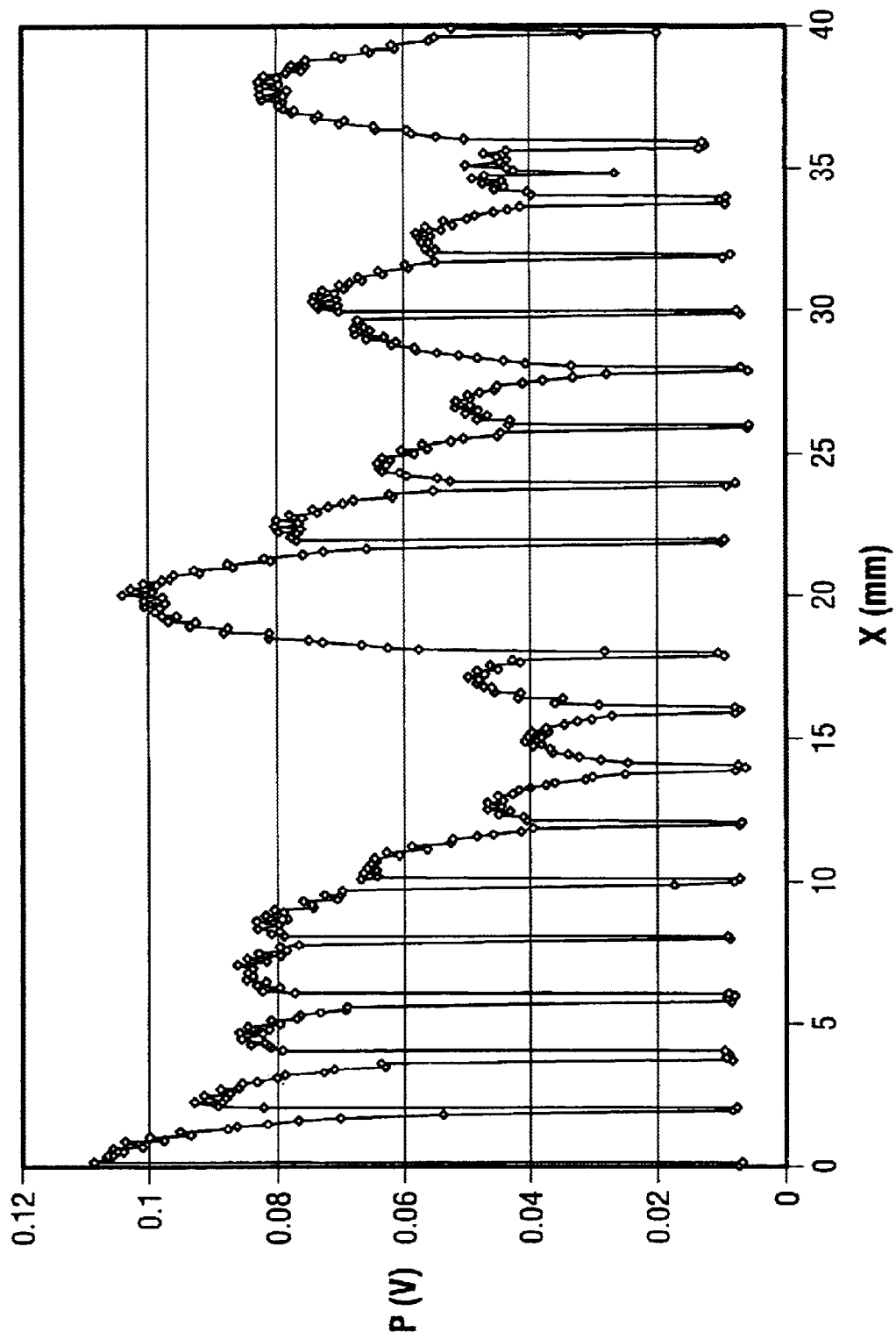
FIG. 8 is a graphic representation of a measurement result obtained with the apparatus of FIG. 7.

FIG. 8 is a graphic representation of a potential measured with the apparatus according to FIG. 7 as a function of the position along a straight line in X-direction over the surface of cell 1, i.e. perpendicular to the fingers 2 extending at a mutual distance of about 2 mm in Y-direction. The absence of sharp minima in the curve for values x=20 respectively x=38 indicates an interruption of finger 2 on the part of the relevant finger 2 located between needle 23 and busbar 3. Contact resistance 11 can be determined for each finger 2 from the magnitude of the potential jump 35 between a point on the relevant finger 2 and the nearest point on emitter 5. Emitter resistance 12 can be determined from the curvature of the relevant parabolic part 34 of potential curve 33. By measuring thus measured potential curves in X-direction for successive values of the Y-coordinate and storing them in a memory it is possible in accordance with a per se known method to produce an image in colour of cell 1 in top view on for instance a screen, on which image the position of errors in cell 1 which cause a contribution to the series resistance can be immediately identified from locally occurring, sudden colour transitions.

What is claimed is:

1. Apparatus for localizing production errors in a photovoltaic element (1) which is formed substantially by a semiconductor substrate (5, 6, 7) in the form of a wafer, on opposite main surfaces of which are arranged electrical conductors (2, 3, 8) for transporting electrical charge carriers, comprising
   at least one first electrode (23) in electrical contact with a first main surface of said substrate and displaceable over said substrate,
   a second electrode (31) to be arranged in electrical contact with a conductor (8) on the second main surface,
   adjusting means (27) for adjusting a bias over the electrical conductors (2, 3, 8) on the opposite main surfaces of said substrate, characterized by
   displacing means (24) for displacing the first electrode (23) over said first main surface in two mutually perpendicular directions, and
   voltage measuring means (25) for measuring the voltage between the at least one first (23) and the second electrode (31) subject to the position of the first electrode (23) on said first main surface.

2. Apparatus as claimed in claim 1, wherein the first main surface is adapted to receive incident light, characterized in that the apparatus further comprises illuminating means (36) for illuminating at least a part of said first main surface.

3. Apparatus as claimed in claim 2 for localizing production errors in a photovoltaic element (1), on said first main surface of which electrical conductors (2) extend in parallel manner, wherein the illuminating means (36) are adapted to project a light spot (32), characterized in that the light spot (32) has a diameter which is greater than the distance between two parallel conductors (2).

4. Apparatus as claimed in claim 2, characterized in that the illuminating means (36) are adapted to project a light spot with a diameter of about 4 mm on said first main surface.

5. Apparatus as claimed in claim 1, characterized in that the bias has a value of zero and the adjusting means (27) consist of short-circuiting means for short-circuiting the electrical conductors (3, 8) on the opposite main surfaces of said substrate.

6. Apparatus as claimed in claim 1, characterized in that the first electrode comprises a needle (23) directed substantially perpendicularly of the substrate and provided with a contact point.

7. Apparatus as claimed in claim 6, characterized in that the contact point has a radius which is smaller than the smallest dimension of an electrical conductor (2) on said first main surface.

8. Apparatus as claimed in claim 7, characterized in that the needle (23) is manufactured substantially from tungsten.

9. Apparatus as claimed in claim 6, characterized in that the contact point has a radius which is smaller than the smallest dimension of an electrical conductor (2) on said first main surface.

10. Apparatus as claimed in claim 6, characterized in that the needle (23) is manufactured substantially from a copper-beryllium alloy.

11. Apparatus for localizing production errors in a photovoltaic element (1) which is formed substantially by a semiconductor substrate (5, 6, 7) in the form of a wafer, on opposite main surfaces of which are arranged electrical conductors (2, 3, 8) for transporting electrical charge carriers, comprising:
    at least one first electrode (23) in electrical contact with a first main surface of said substrate and displaceable over said substrate;
    a second electrode (31) to be arranged in electrical contact with a conductor (8) on the second main surface, and adjusting means (27) for adjusting a bias over the electrical conductors (2, 3, 8) on the opposite main surfaces of said substrate, characterized by displacing means (24) for displacing the first electrode (23) over said first main surface in two mutually perpendicular directions, and voltage measuring means (25) for measuring the voltage between the at least one first (23) and the second electrode (31) subject to the position of the first electrode (23) on said first main surface, said first electrode comprising a needle (23) directed substantially perpendicularly of the substrate and provided with a contact point.

12. Apparatus as claimed in claim 11, characterized in that the contact point has a radius which is smaller than the smallest dimension of an electrical conductor (2) on said first main surface.

13. Apparatus as claimed in claim 11, characterized in that the needle (23) is manufactured from a copper-beryllium alloy.

14. Apparatus as claimed in claim 11, characterized in that the needle (23) is manufactured from tungsten.

15. Apparatus as claimed in claim 1, characterized in that the needle (23) is manufactured substantially from tungsten.

* * * * *